United States Patent
Tanaka et al.

(10) Patent No.: US 7,420,650 B2
(45) Date of Patent: Sep. 2, 2008

(54) METHOD OF SETTING PROCESSING CONDITION IN PHOTOLITHOGRAPHY PROCESS, APPARATUS FOR SETTING PROCESSING CONDITION IN PHOTOLITHOGRAPHY PROCESS, PROGRAM, AND COMPUTER READABLE RECORDING MEDIUM

(75) Inventors: Michio Tanaka, Koshi (JP); Masahide Tadokoro, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/362,087

(22) Filed: Feb. 27, 2006

(65) Prior Publication Data

US 2006/0198633 A1    Sep. 7, 2006

(30) Foreign Application Priority Data

Mar. 2, 2005    (JP) ............................. 2005-057892

(51) Int. Cl.
    G03B 27/42    (2006.01)
(52) U.S. Cl. .............................. 355/30; 355/53; 378/34; 378/35
(58) Field of Classification Search .................. 396/578, 396/611; 430/30, 311, 330; 355/30, 53; 378/34, 35
    See application file for complete search history.

(56) References Cited

U.S. PATENT DOCUMENTS 6,410,194 B1 *    6/2002 Yoshihara .................... 430/30
6,816,230 B2 *    11/2004 Lim ............................ 355/27

OTHER PUBLICATIONS

Masafumi Asano, et al, "CD Control with Effective Exposure Dose Monitor Technique in Photolithography", Proc. SPIE vol. 4691, 2002, pp. 280-287.
Alexander Starikov, "Exposure Monitor Structure", SPIE vol. 1261 Integrated Circuit Metrology, Inspection, and Process Control IV (1990), pp. 315-324.

* cited by examiner

*Primary Examiner*—Della J. Rutledge
(74) *Attorney, Agent, or Firm*—Oblon, Spivak, McClelland, Maier & Neustadt, P.C.

(57) ABSTRACT

In the present invention, in the photolithography process in which a certain processing condition has been already set, a resist film on a substrate is exposed to light using a mask, which reduces only zero-order light of a light source at a predetermined light reduction rate and transmits the light, and then heated and developed so that the film on the substrate is reduced. Thereafter, the reduction in film thickness of the resist film is measured. The measured reduction in film thickness is then converted into a line width of a resist pattern on the already-set processing condition by a correlation function between the reduction in film thickness and the line width. Based on the converted line width, the temperature setting of the heating temperature at the time of heating after the exposure is performed. Consequently, the condition setting in the photolithography process is appropriately performed, resulting in improved uniformity of the line width of the resist pattern within the substrate.

14 Claims, 13 Drawing Sheets

$$Pt < \frac{\lambda}{NA \cdot (1+\sigma)} \quad \cdots (1)$$

FIG.12
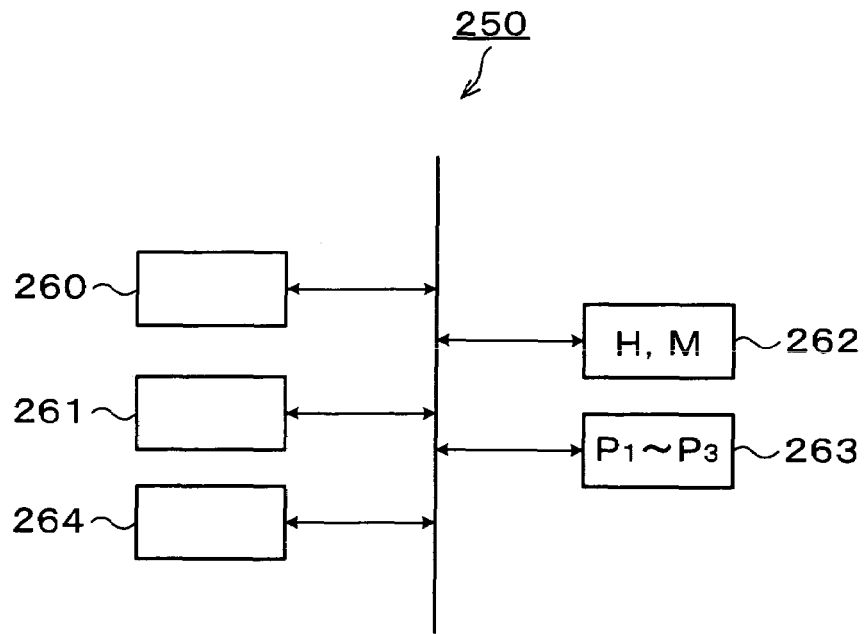
FIG.13
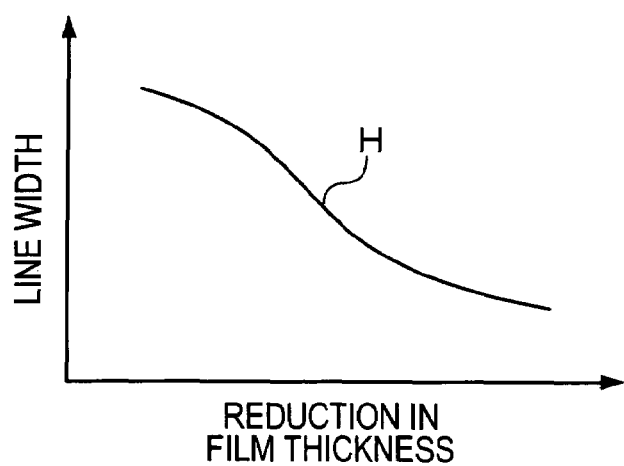
FIG.14
$$\Delta CD = M \cdot \Delta T \quad \cdots (2)$$

FIG.16
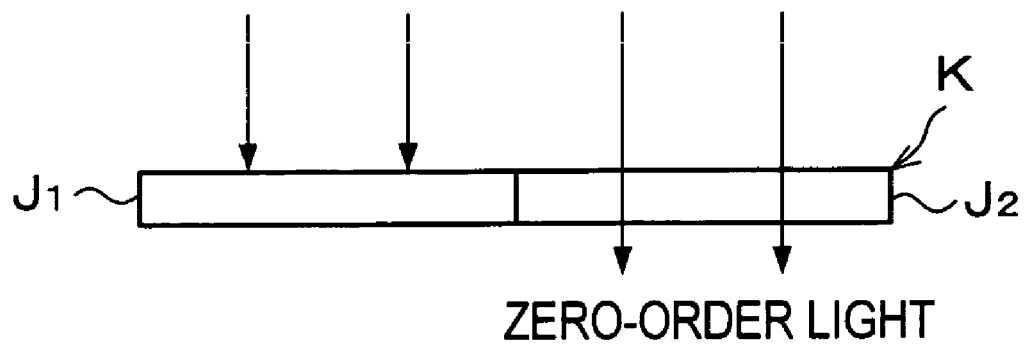
ZERO-ORDER LIGHT
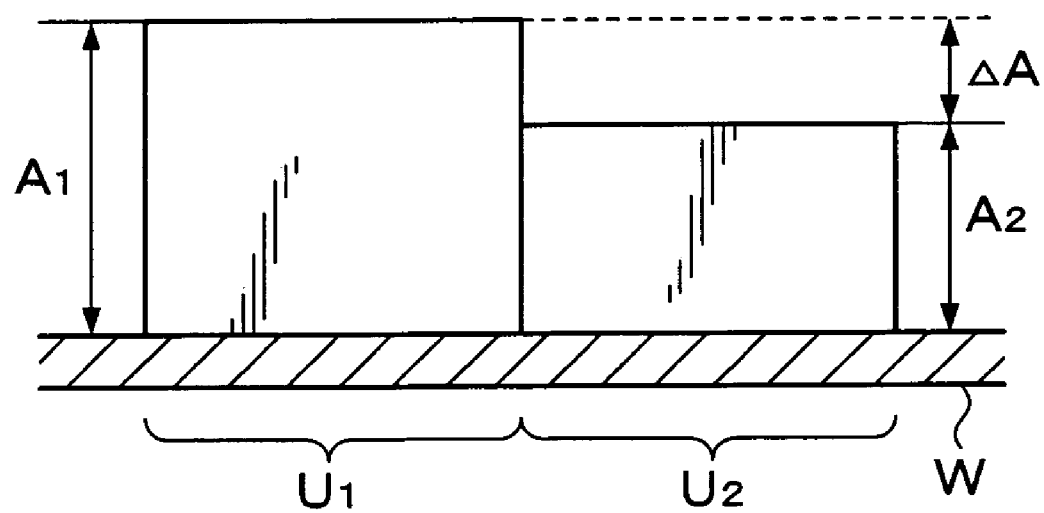

METHOD OF SETTING PROCESSING CONDITION IN PHOTOLITHOGRAPHY PROCESS, APPARATUS FOR SETTING PROCESSING CONDITION IN PHOTOLITHOGRAPHY PROCESS, PROGRAM, AND COMPUTER READABLE RECORDING MEDIUM

BACKGROUND OF THE INVENTION

1. Field of the Invention

The present invention relates to a method of setting a processing condition in a photolithography process, an apparatus for setting a processing condition in a photolithography process, a program, and a computer readable recording medium.

2. Description of the Related Art

In a photolithography process in a manufacturing process of a semiconductor device, a plurality of processing and treatments are sequentially performed, for example, resist coating treatment in which a resist film is formed by applying a resist solution onto a wafer surface; exposure processing in which light in a predetermined pattern is applied to the resist film on the wafer to thereby expose the wafer to the light; heat-processing after the exposure which promotes chemical reaction in the resist film (post-exposure baking); developing treatment in which the exposed resist film is selectively dissolved with a developing solution, and so on, so that a predetermined pattern is formed in the resist film on the wafer.

Incidentally, it is necessary to form, on the wafer, the resist pattern with line widths having a uniform predetermined dimension within the wafer. Further, the line width of the resist pattern is greatly affected by processing conditions of, for example, the exposure processing and the heat-processing subsequent thereto in the lithography process. Hence, it has been proposed, as a method of setting the processing conditions in the photolithography process, to measure the line width of the resist pattern formed on the wafer and set the heating temperature in heat-processing after the exposure based on the measurement result (Japanese Patent Application Laid-open No. 2001-143850).

In the aforementioned line width measurement, however, it is necessary to use a so-called electronic CD-SEM (Scanning electron microscope) which measures the line width by applying electron beams to the wafer. In this case, a large quantity of electrons collide against the wafer and may damage, for example, the resist pattern on the wafer. Therefore, the sufficient accuracy of the line width measurement is not secured, causing difficulties to ensure the sufficient accuracy for setting of the heating temperature performed based on the line width measurement. In addition, the line width measurement by the CD-SEM suffers from a disadvantage of consuming much time.

Besides, the result of the line width measurement in the prior art includes a component that is uncontrollable even if the heating temperature after the exposure is adjusted, for example, a component due to the focus at the time of exposure (a focus component). Therefore, there are limitations even if the heating temperature is controlled to thereby make line widths uniform within the wafer based on the result of the line width measurement as in the prior art.

SUMMARY OF THE INVENTION

The present invention has been developed in consideration of the above viewpoint, and its object is to detect the line width required to set processing conditions such as a heating temperature quickly and accurately to thereby appropriately set the processing conditions in the photolithography process.

To achieve the above object, the present invention is a method of setting a processing condition in a photolithography process of forming a resist pattern on a substrate, including the steps of: exposing a film on the substrate to light using a mask transmitting only zero-order light of a light source and then developing the film to reduce the film on the substrate in the photolithography process in which a certain processing condition has been already set; measuring a film thickness of the reduced film; converting the measured film thickness into a line width of the resist pattern by a previously obtained correlation between the film thickness and the line width; and setting a new processing condition based on the converted line width.

According to the present invention, the exposure is performed using the mask transmitting only the zero-order light of the light source, so that the film on the substrate is exposed to light with the focus component of light caused by the interference of the zero-order light and the first-order light and higher being removed. The film thickness of the film reduced by the exposure and the development subsequent thereto is measured and converted into a line width, so that a line width which does not result from focus can be calculated and processing conditions can be set based on the line width. Accordingly, the processing conditions can be set from the controllable line width component, thus enabling more accurate setting. Further, since the film thickness is measured and converted into the line width, it is possible to detect the line width using the film thickness measuring unit rather than using the CD-SEM as in the prior art. The use of the film thickness measuring unit enables accurate measurement without damage to the resist pattern and reduction in the time required for measurement. Therefore, according to the present invention, the setting of the processing conditions in the photolithography process can be performed more appropriately to improve the dimensional accuracy and the uniformity of the line width of the resist pattern within the substrate.

A heating temperature at the time of heating after the exposure and before the development in the photolithography process may be set based on the converted line width. Further, an exposure amount at the time of exposure in the photolithography process may be set based on the converted line width. In these cases, the line width depending on the heating temperature after the exposure and the exposure amount at the time of exposure is calculated so that the heating temperature and the exposure amount are set based on the line width, thereby allowing more optimum processing conditions to be set.

A reduction in film thickness may be calculated from the measured film thickness, and the calculated reduction in film thickness may be converted into the line width of the resist pattern by a previously obtained correlation between the reduction in film thickness and the line width.

The substrate may be exposed to light using a mask having a region transmitting the zero-order light of the light source and a region not transmitting the light of the light source, and the reduction in film thickness may be obtained by calculating a film thickness difference between portions of the film on the substrate corresponding to the two regions. In this case, the reduction in film thickness is obtained from the film thickness difference, so that an error in the measurement due to, for example, a base of the film at the time of film thickness measurement is canceled, thus ensuring that the reduction in film thickness is calculated with higher accurately. As a result of this, a more accurate line width is calculated to enable setting of processing conditions with higher precision.

The mask may be formed with a plurality of regions which transmit the zero-order light and are different in transmittance. The formation of a plurality of regions different in transmittance in the mask ensures that even if, for example, the film is changed in sensitivity to exposure, the light at the time of exposure can be sufficiently reduced through use of any of the regions to remain the film after development. This results in measurement of the above-described film thickness without fail.

The present invention according to another aspect is an apparatus for setting a processing condition in a photolithography process of forming a resist pattern on a substrate. The setting apparatus includes: a film thickness measuring unit for measuring a thickness of a film on the substrate when the film on the substrate is exposed to light using a mask transmitting only zero-order light of a light source and then developed to be reduced in the photolithography process in which a certain processing condition has been already set; and a setting unit for converting the measured film thickness into a line width of the resist pattern by a previously obtained correlation between the film thickness and the line width, and setting a new processing condition based on the converted line width.

The setting unit may set a heating temperature at the time of heating after the exposure and before the development in the photolithography process based on the converted line width. Further, the setting unit may set an exposure amount at the time of exposure in the photolithography process based on the converted line width.

The setting unit may calculate a reduction in film thickness from the measured film thickness, and may convert the calculated reduction in film thickness into the line width of the resist pattern by a previously obtained correlation between the reduction in film thickness and the line width.

The mask may be formed with a region transmitting the zero-order light of the light source and a region not transmitting the light of the light source; and the setting unit may obtain the reduction in film thickness by calculating a film thickness difference between portions of the film on the substrate corresponding to the two regions of the mask.

The mask may be formed with a plurality of regions which transmit the zero-order light and are different in transmittance.

According to another aspect, the present invention is a computer program product used in an apparatus for setting a processing condition in a photolithography process, the setting apparatus including: a film thickness measuring unit for measuring a thickness of a film on a substrate when the film on the substrate is exposed to light using a mask transmitting only zero-order light of a light source and then developed to be reduced in the photolithography process in which a certain processing condition has been already set; and a setting unit. The computer program product of the present invention includes: computer readable program code means for causing a computer to convert the film thickness measured by the film thickness measuring unit into a line width of a resist pattern by a previously obtained correlation between the film thickness and the line width and to set a new processing condition based on the converted line width, in the setting apparatus.

Such a computer program product is recorded, for example, on a computer readable recording medium, such as a hard disk, a compact disk, a magneto-optical disk, a floppy disk or the like.

BRIEF DESCRIPTION OF THE DRAWINGS

FIG. 12 is a block diagram showing a configuration of a temperature setting unit;

FIG. 13 is a graph showing a correlation function between the line width and the reduction in film thickness;

FIG. 14 is a relational expression between the variation in line width and the temperature correction value using a calculation model;

FIG. 16 is a longitudinal sectional view of a pattern and a resist film for explaining the film thickness of each portion of the resist film at the time of measuring the film thickness.

DETAILED DESCRIPTION OF THE INVENTION

Figure 1:
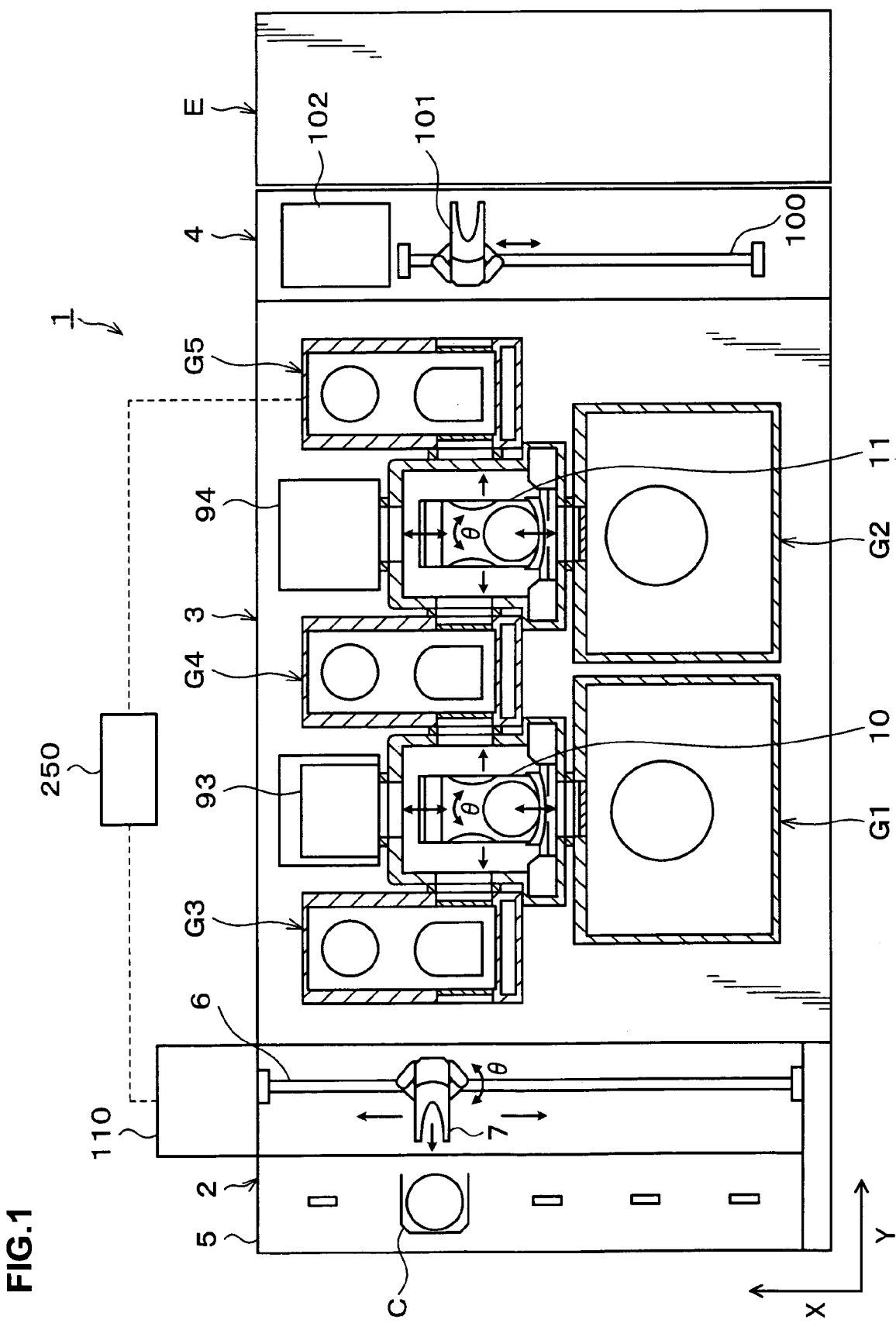
FIG. 1 is a plan view showing a configuration of a coating and developing treatment system.
Figure 2:
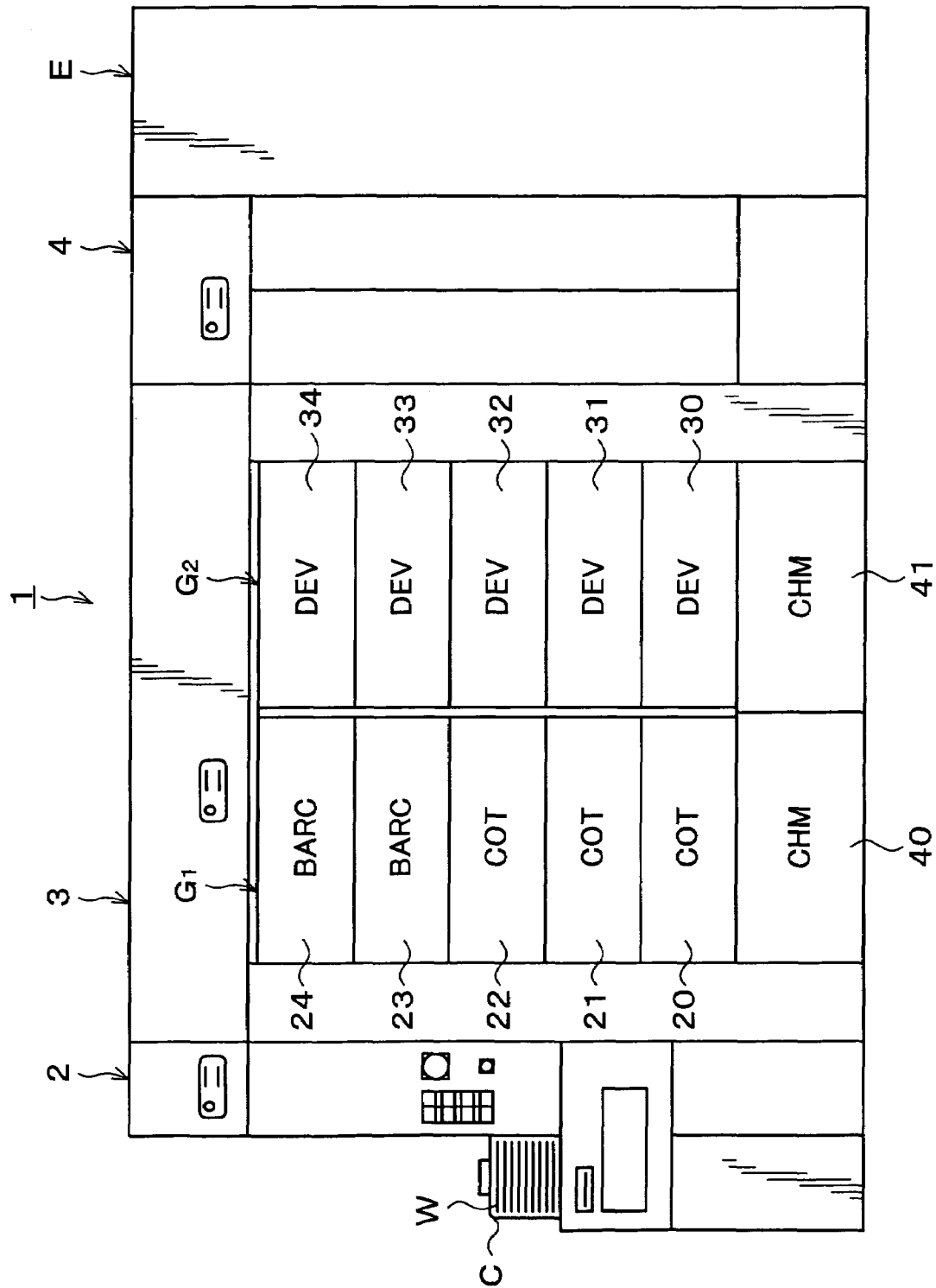
FIG. 2 is a front view of the coating and developing treatment system in FIG. 1.
Figure 3:
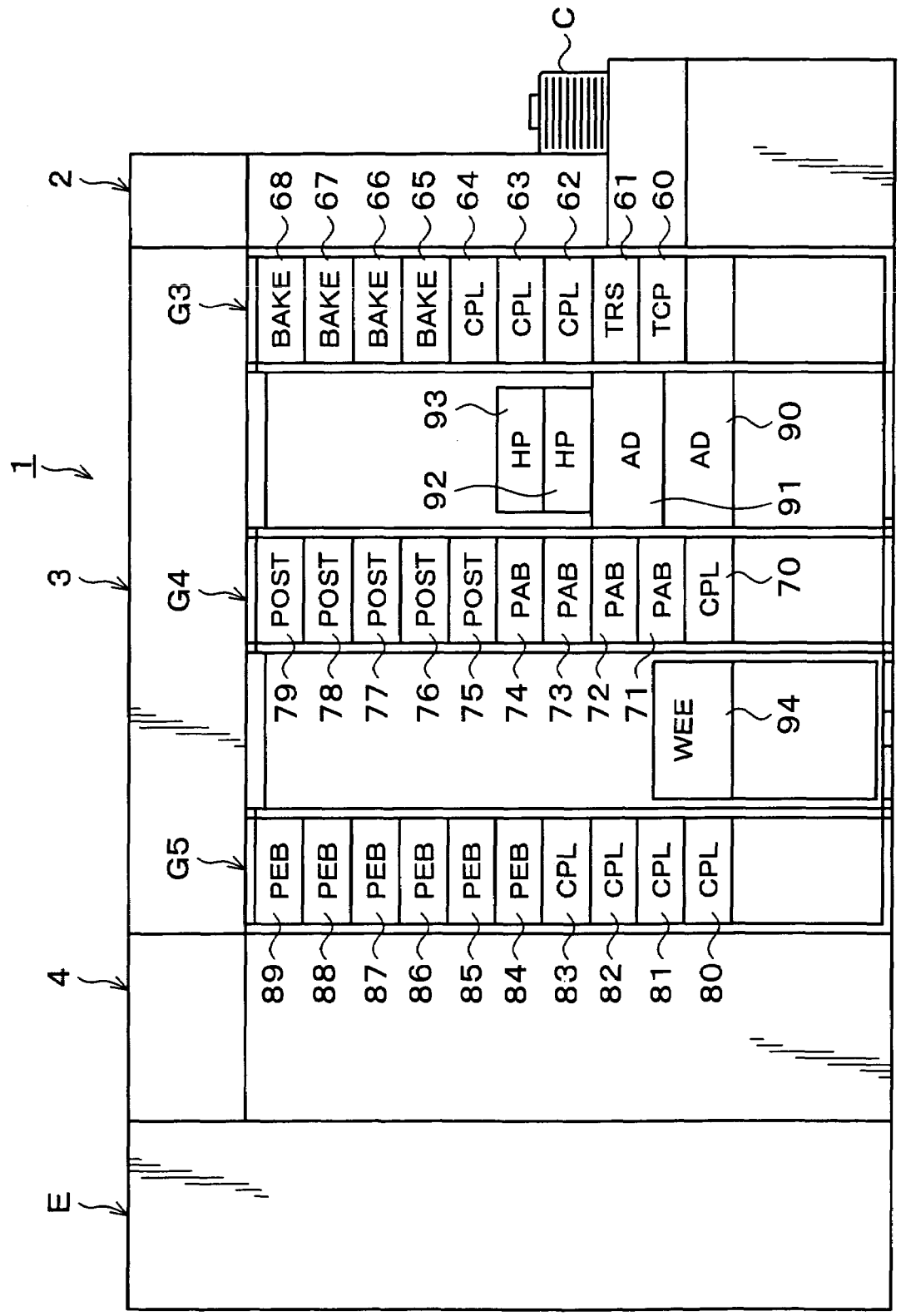
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 in which an apparatus for setting processing conditions in a photolithography process according to the embodiment is applied, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for carrying, for example, 25 wafers W per cassette as a unit from/to the outside into/from the coating and developing treatment system 1 and carrying the wafers W into/out of a cassette C; a processing station 3 including a plurality of various kinds of processing and treatment units, which are multi-tiered, for performing predetermined processing or treatments in a manner of single wafer processing in the photolithography process; and an interface section 4 for transferring the wafers W to/from an aligner E provided adjacent to the processing station 3, are integrally connected together.

In the cassette station 2, a cassette mounting table 5 is provided and configured such that a plurality of cassettes C can be mounted on the cassette mounting table 5 in a line in an X-direction (a top-to-bottom direction in FIG. 1). In the cassette station 2, a wafer carrier 7 is provided which is movable in the X-direction on a carrier path 6. The wafer carrier 7 is also movable in a wafer-arrangement direction of the wafers W housed in the cassette C (a Z-direction; the vertical direction), and thus can selectively access the wafers W in each of the cassettes C arranged in the X-direction.

The wafer carrier 7, which is rotatable in a θ-direction around the Z-axis, can access a later-described temperature regulating unit 60 and a transition unit 61 included in a third processing unit group G3 on the processing station 3 side.

To the cassette station 2, for example, on the rear side, a film thickness measuring unit 110 is connected as a later-described film thickness measuring unit. The wafer carrier 7 can carry the wafer W also to the film thickness measuring unit 110.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first carrier unit 10 is provided. The first carrier unit 10 can selectively access the processing and treatment units in the first processing unit group G1, the third processing unit group G3, and the fourth processing unit group G4 and carry the wafer W to them. Between the fourth processing unit group G4 and the fifth processing unit group G5, a second carrier unit 11 is provided. The second carrier unit 11 can selectively access the processing and treatment units in the second processing unit group G2, the fourth processing unit group G4, and the fifth processing unit group G5 and carry the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under temperature control with a high precision, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for performing thermal processing for the wafer W, for example, high-precision temperature regulating units 80 to 83, and post-exposure baking units (hereinafter referred to as "PEB units") 84 to 89 each for heat-processing the wafer W after exposure, are ten-tiered in order from the bottom.

As shown in FIG. 1, a plurality of processing and treatment units are arranged on the positive direction side in the X-direction of the first carrier unit 10, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the positive direction side in the X-direction of the second carrier unit 11, for example, an edge exposure unit 94 is disposed which selectively exposes only the edge portion of the wafer W to light.

In the interface section 4, for example, a wafer carrier 101 moving on a carrier path 100 extending in the X-direction and a buffer cassette 102 are provided as shown in FIG. 1. The wafer carrier 101 is movable in the Z-direction and also rotatable in the θ-direction and thus can access the aligner E adjacent to the interface section 4, the buffer cassette 102, and the processing and treatment units in the processing unit group G5 and carry the wafer W to them.

Figure 4:
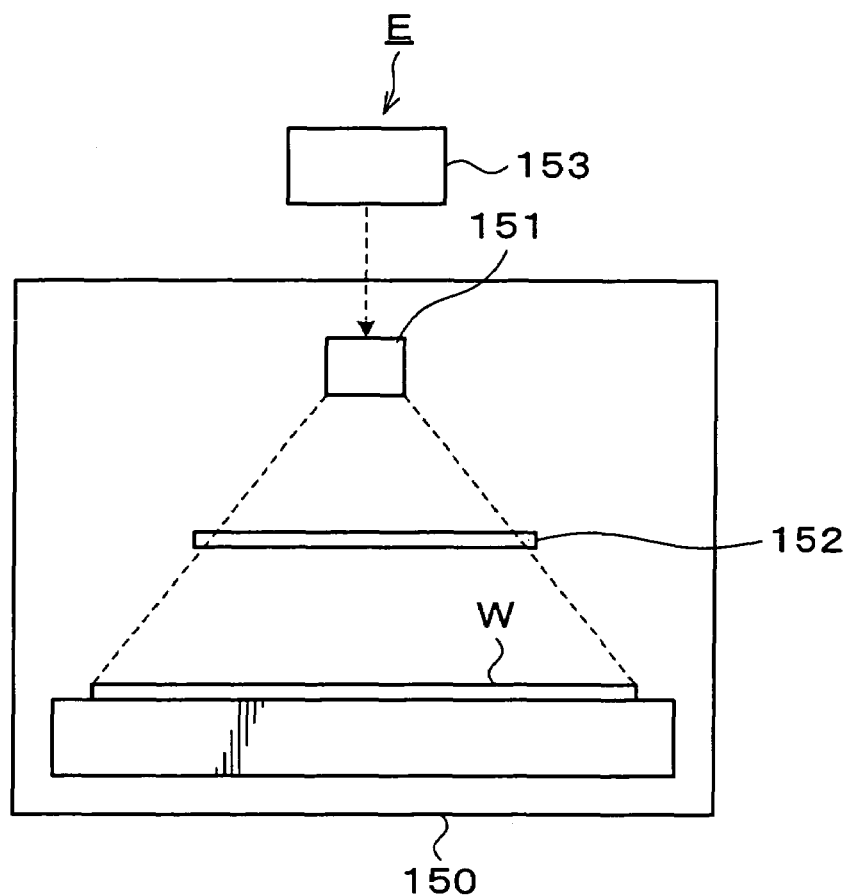
FIG. 4 is an explanatory view showing the outline of a configuration of an aligner.

The aligner E includes, as shown in FIG. 4, for example, a mounting table 150 on which the wafer W is mounted at a predetermined position, a light source 151 for applying light to the wafer W mounted on the mounting table 150, and a mask 152 with a predetermined pattern laid out. The mask 152 is arranged between the mounting table 150 and the light source 151. The aligner E can apply light from the light source 151 through the mask 152 to the wafer W on the mounting table 150 to thereby expose the resist film on the wafer W in the predetermined pattern. The application of light of the light source 151 is controlled by an exposure controller 153 in which exposure conditions are set such as the exposure amount (dose of light), focus, and so on.

Figure 5:
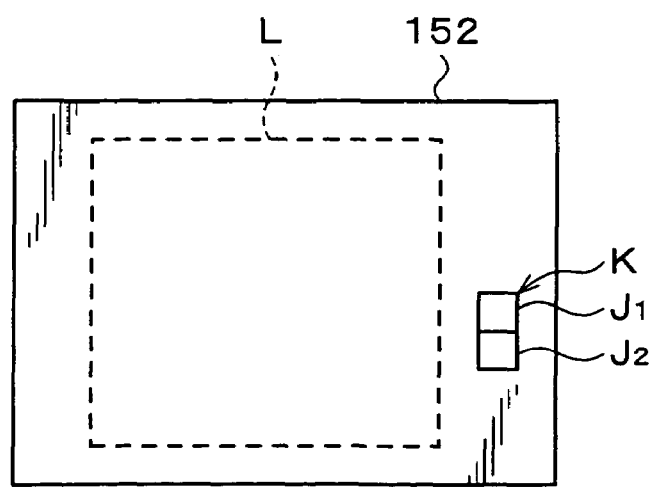
FIG. 5 is a plan view of a mask.

The mask 152 in the aligner E is formed with, for example, a pattern L for products and a pattern K for measuring the film thickness as shown in FIG. 5. The film thickness measuring pattern K is composed of, for example, two regions J1 and J2.

Figures 6, 7:
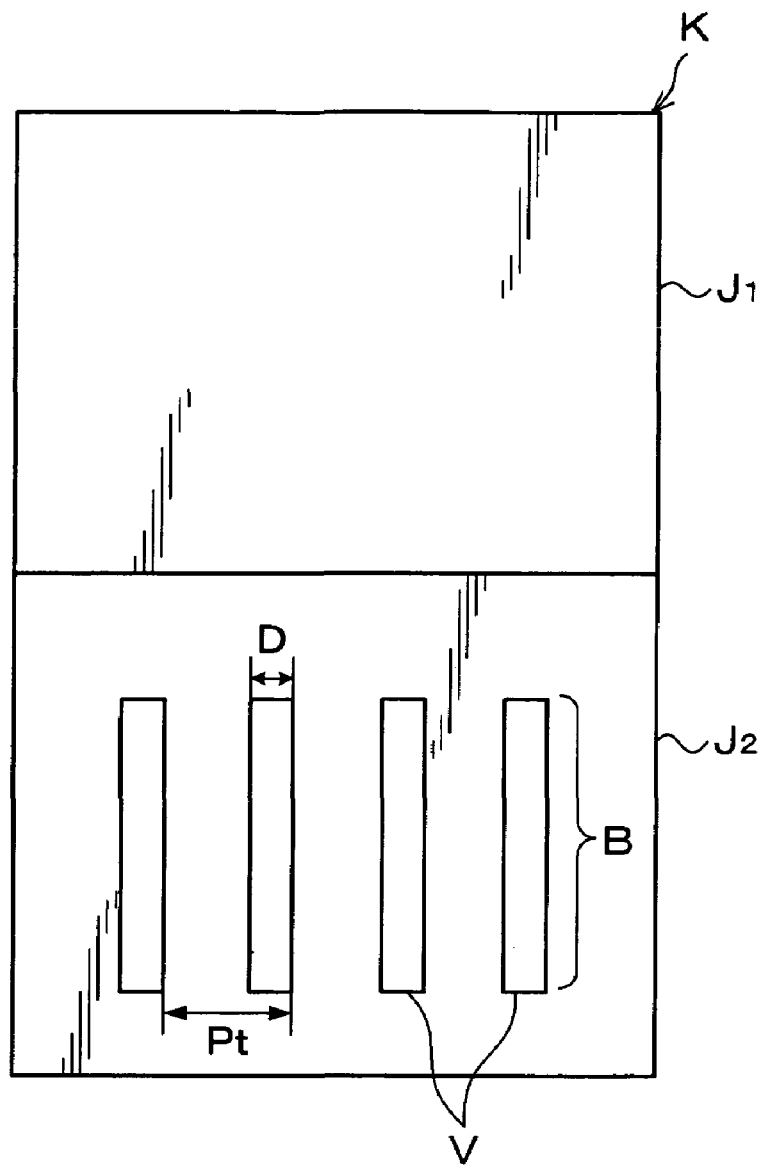
FIG. 6 is an explanatory view showing a pattern for measuring the film thickness of the mask.
FIG. 7 is a conditional expression met by a pitch between slits in the film thickness measuring pattern.

As shown in FIG. 6, the first region J1 is formed such that the transmittance is, for example, 0%, that is, light is blocked.

For example, the second region J2 is formed with a pattern B which transmits only zero-order light of the light from the light source 151 and reduces the exposure amount through the whole second region J2 to a predetermined transmittance, for example, 10%. This pattern B is formed, for example, on a line-and-space basis, such that a plurality of rectangular slits V of the same shape are arranged side by side at regular intervals. The slits V are formed such that a pitch Pt between the slits V in the pattern B meets a conditional expression (1) in FIG. 7, thereby allowing transmission of only the zero-order light of the light source 151. It should be noted that, in the expression (1), NA represents the number of openings, a represents the coherence factor, and λ represents the wavelength of light. This removes high order light, that is, ± first-order light and higher order light from the light transmitted through the second region J2, leaving only the zero-order light, so that the transmitted light includes no focus component of light caused by interference of the zero-order light and the higher order light but includes only the component of exposure amount by the zero-order light. With a width D of a shorter side of the slit V in the pattern B, the transmittance is adjusted to be 10% in the second region J2.

Figure 8:
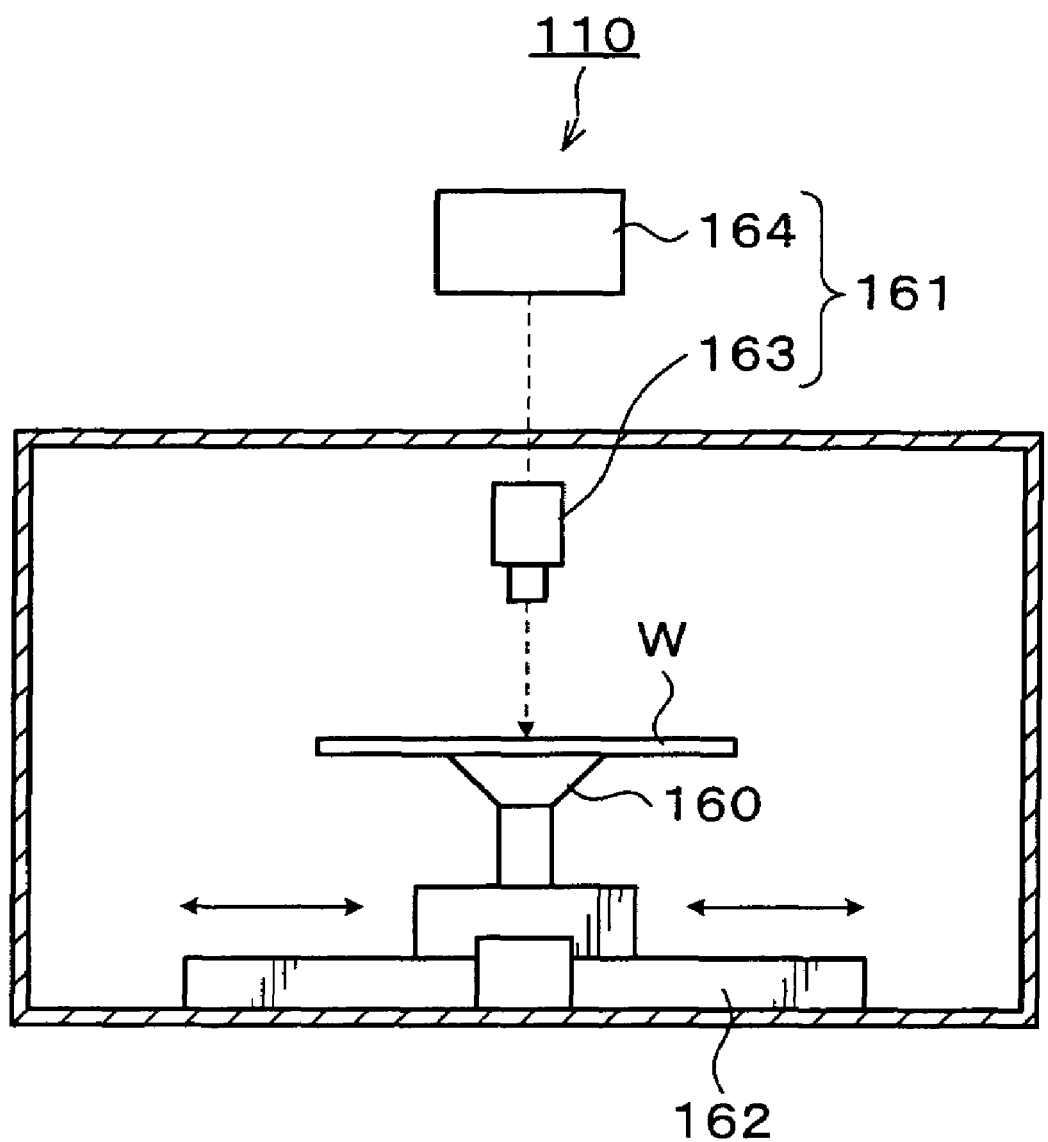
FIG. 8 is an explanatory view of a longitudinal section showing the outline of a configuration of a film thickness measuring unit.

The film thickness measuring unit 110 includes, for example, a chuck 160 for horizontally holding the wafer W and a light interference type film thickness gauge 161 as shown in FIG. 8. The chuck 160 is placed on, for example, an X-Y stage 162 and is thus movable in horizontal directions in two dimensions. The light interference type film thickness gauge 161 includes, for example, a probe 163 for applying light to the wafer W and receiving its reflected light, and a measuring unit 164 for measuring the thickness of a film on the wafer W based on information on the light received by the probe 163. By moving the wafer W relative to the probe 163, the film thickness can be measured at a plurality of locations within the wafer, for example, later-described wafer regions $W_1$ to $W_5$ corresponding to heating plate regions $R_1$ to $R_5$.

Figure 9:
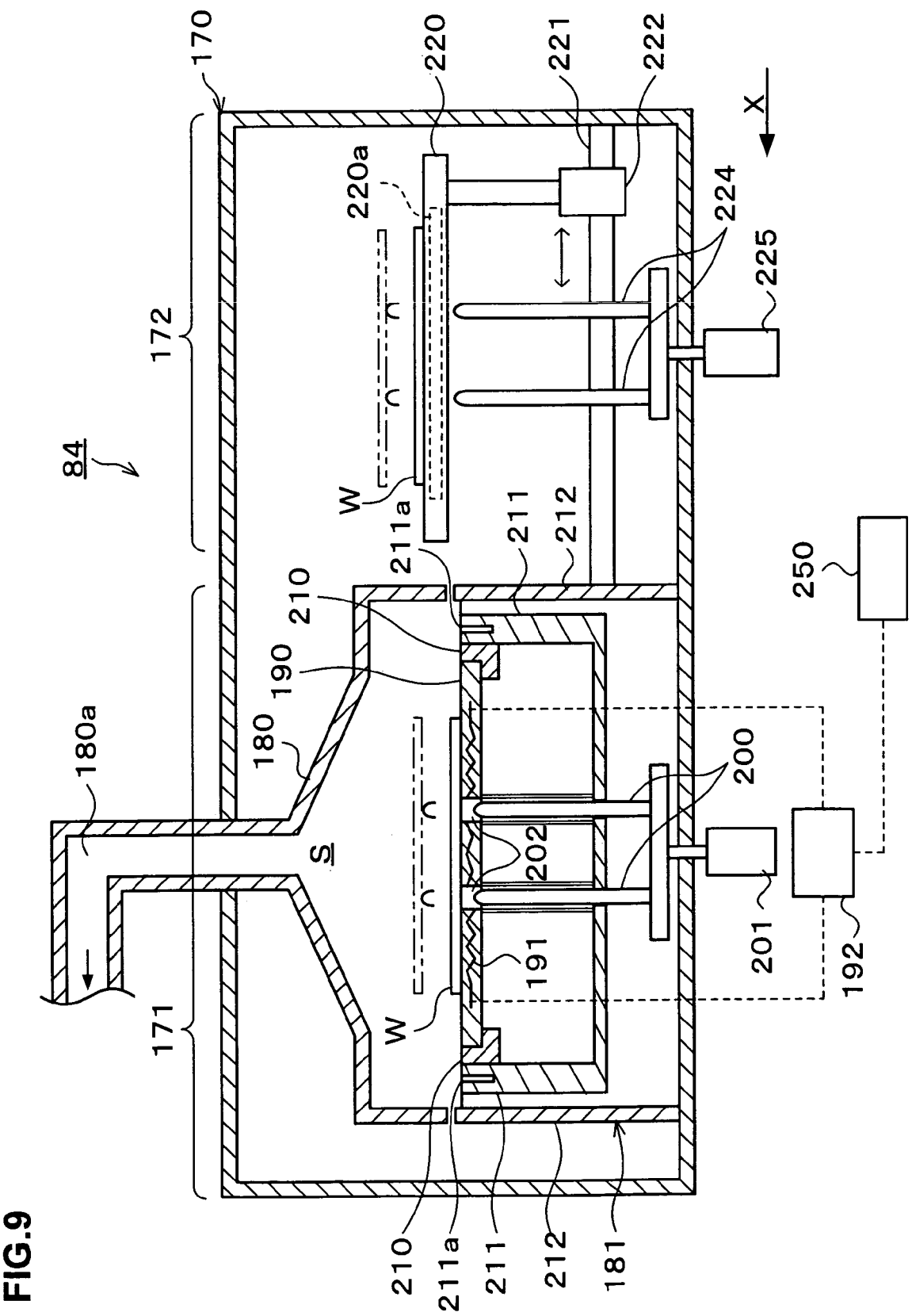
FIG. 9 is an explanatory view of a longitudinal section showing the outline of a configuration of a PEB unit.
Figure 10:
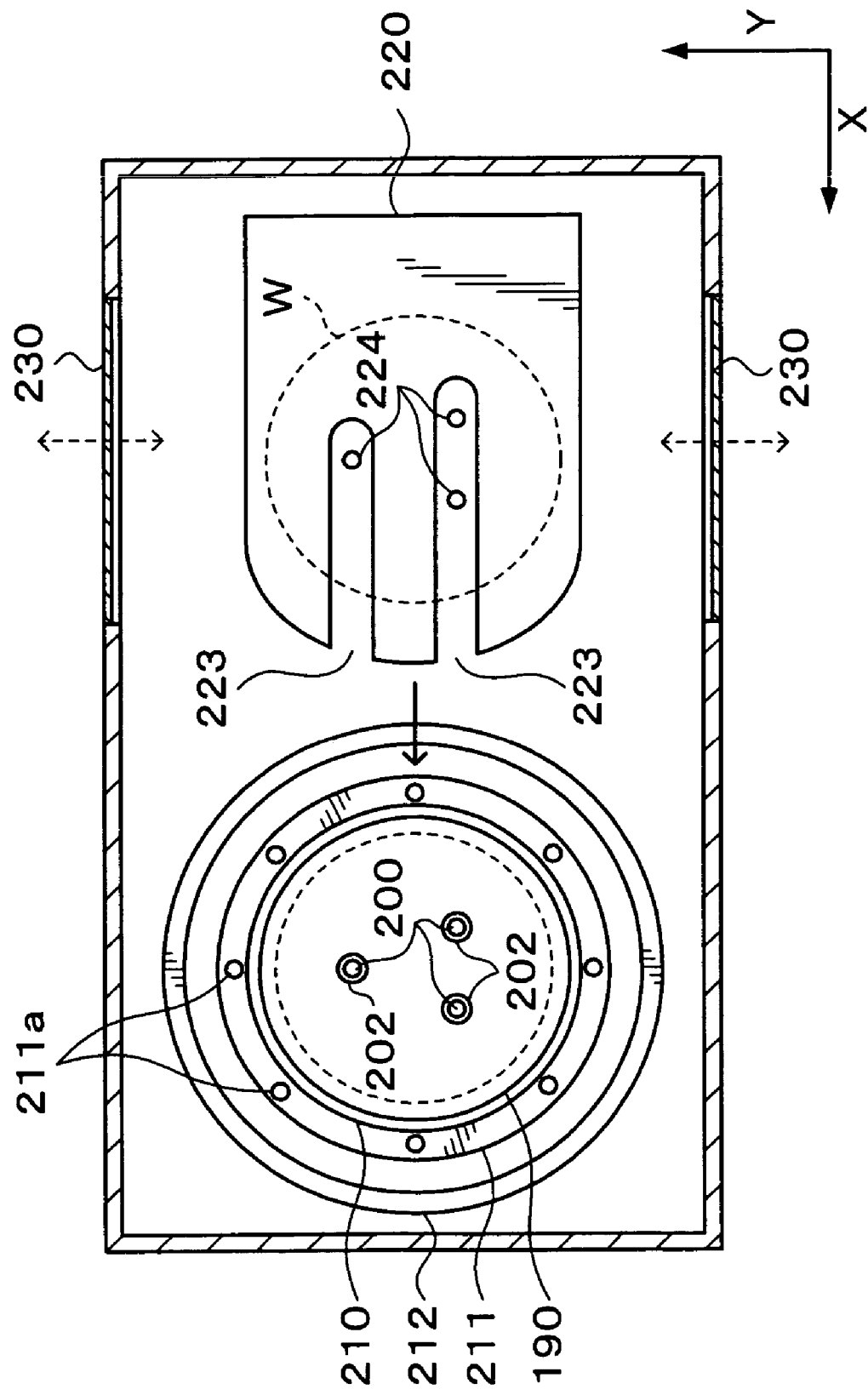
FIG. 10 is a plan view showing a configuration of a heating plate of the PEB unit.

Next, a configuration of the PEB unit 84 in the processing station 3 will be described. FIG. 9 is an explanatory view of a longitudinal section showing the outline of the configuration of the PEB unit 84. FIG. 10 is an explanatory view of a transverse section showing the outline of the configuration of the PEB unit 84. The PEB unit 84 includes, as shown in FIG. 9, a heating unit 171 for performing heat-processing for the wafer W and a cooling unit 172 for performing cooling processing for the wafer W in a housing 170.

The heating unit 171 includes a lid body 180 which is located at the upper side and freely vertically movable, and a heating plate accommodating unit 181 which is located at the lower side and united with the lid body 180 to form a processing chamber S.

The lid body 180 has a form of a substantially circular cone shape which is gradually higher toward its center, and is provided with an exhaust portion 180a at its tip portion. The atmosphere in the processing chamber S is uniformly exhausted through the exhaust portion 180a.

At the center of the heating plate accommodating unit 181, a heating plate 190 is provided which mounts and heats the wafer W thereon. The heating plate 190 has a substantially disk shape with a large thickness.

Figure 11:
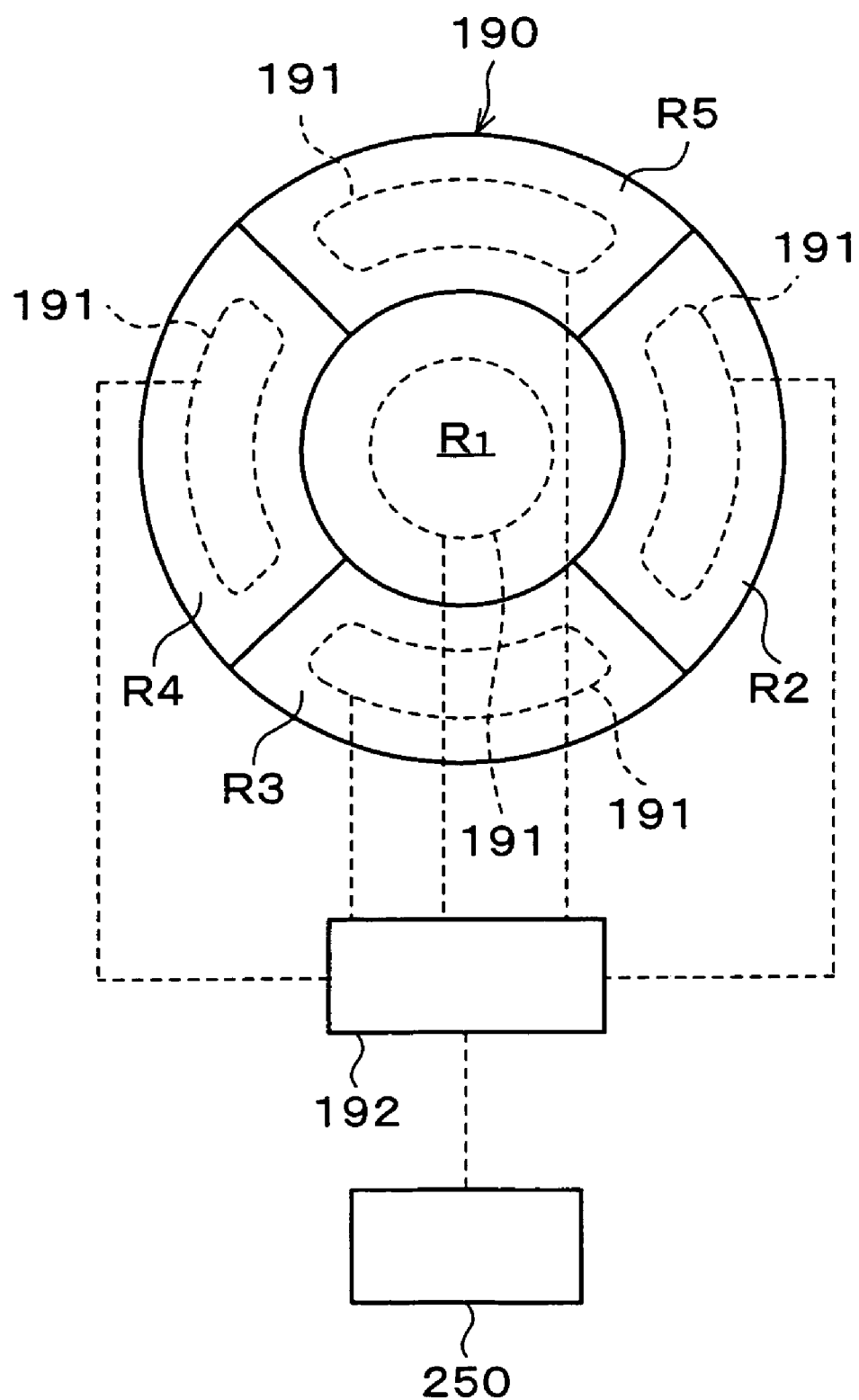
FIG. 11 is a plan view showing the configuration of the heating plate.

The heating plate 190 is divided into a plurality of, for example, five heating plate regions $R_1$, $R_2$, $R_3$, $R_4$, and $R_5$ as shown in FIG. 11. The heating plate 190 is divided, for example, into the circular heating plate region $R_1$ located at the center portion as seen from above and the heating plate regions $R_2$ to $R_5$ made by equally dividing the peripheral portion of the heating plate region $R_1$ into four sectors.

A heater 191 generating heat by power feeding is individually embedded in each of the heating plate regions $R_1$ to $R_5$ of the heating plate 190 and can individually heat each of the heating plate regions $R_1$ to $R_5$. The heating value of the heater 191 in each of the heating plate regions $R_1$ to $R_5$ is adjusted by a temperature controller 192. The temperature controller 192 can adjust the heating value of the heater 191 to control the temperature within each of the heating plate regions $R_1$ to $R_5$ to a predetermined set temperature. The temperature setting in the temperature controller 192 is performed by, for example, a later-described temperature setting unit 250.

As shown in FIG. 9, below the heating plate 190, first raising and lowering pins 200 are provided for raising and lowering the wafer W while supporting the wafer W from below. The first raising and lowering pins 200 can be moved up and down by a raising and lowering drive mechanism 201. The heating plate 190 is formed, near its center portion, with through holes 202 penetrating the heating plate 190 in a direction of its thickness. The first raising and lowering pins 200 can rise from below the heating plate 190, pass through the through holes 202, and project to above the heating plate 190.

The heating plate accommodating unit 181 has an annular holding member 210 for accommodating the heating plate 190 and holding the outer periphery of the heating plate 190, and a substantially cylindrical support ring 211 surrounding the outer periphery of the holding member 210. The upper surface of the support ring 211 is formed with jet ports 211a for jetting, for example, an inert gas toward the inside of the processing chamber S. Jetting the inert gas from the jet ports 211a can purge the processing chamber S. Further, outside the support ring 211, a cylindrical case 212 is provided which is the outer periphery of the heating plate accommodating unit 181.

In the cooling unit 172 adjacent to the heating unit 171, for example, a cooling plate 220 is provided which mounts and cools the wafer W thereon. The cooling plate 220 has, for example, a substantially square flat shape as shown in FIG. 10, and is curved in an arc shape at its end face on the heating unit 171 side. As shown in FIG. 9, a cooling member 220a, for example, a Peltier element or the like is embedded in the cooling plate 220 and can adjust the cooling plate 220 to a predetermined set temperature.

The cooling plate 220 is attached to a rail 221 extending toward the heating unit 171 side. The cooling plate 220 can move on the rail 221 by means of a drive unit 222. The cooling plate 220 can move to a position above the heating plate 190 on the heating unit 171 side.

The cooling plate 220 is formed with, for example, two slits 223 along the X-direction as shown in FIG. 10. The slits 223 are formed starting from the end face on the heating unit 171 side to near the center portion of the cooling plate 220. The slits 223 prevent the first raising and lowering pins 200 projecting to above the heating plate 190 from interfering with the cooling plate 220 moved to the heating unit 171 side. As shown in FIG. 9, below the slits 223 in the cooling unit 172, second raising and lowering pins 224 are provided. The second raising and lowering pins 224 can be moved up and down by a raising and lowering drive mechanism 225. The second raising and lowering pins 224 can rise from below the cooling plate 220, pass through the slits 223, and project to above the cooling plate 220.

As shown in FIG. 10, both side surfaces of the housing 170 across the cooling plate 220 are formed with carrier-in/out ports 230 to carry in/out the wafer W respectively.

Next, a configuration of the temperature setting unit 250 for setting the temperature of the heating plate 190 of the above-described PEB unit 84 will be described. The temperature setting unit 250 is composed of, for example, a general-purpose computer including a CPU, a memory, and so on, and is connected to the temperature controller 192 for the heating plate 190 as shown in FIG. 9 and FIG. 11. Note that the temperature setting unit 250 in this embodiment has a function as a setting unit.

As shown in FIG. 12, the temperature setting unit 250 includes: for example, a calculation unit 260 composed of a CPU for executing various kinds of programs; an input unit 261 composed of, for example, a keyboard or-the like for inputting various kinds of information; a data storage unit 262 composed of a memory for storing various kinds of information; a program storage unit 263 for storing various kinds of programs; and a communication unit 264 for communicating with the temperature controller 192 and the film thickness measuring unit 110 and so on.

The data storage unit 262 stores a correlation function H, which is previously obtained, between the reduction in film thickness and the line width as shown in FIG. 13. This correlation function H is a relational expression showing the correlation between the reduction in film thickness and the line width when exposure is performed using, for example, the film thickness measuring pattern K in the mask 152. This correlation function H has been obtained, for example, by an experiment which has been previously performed. This correlation function H can convert the reduction in film thickness measured by the film thickness measuring unit 110 into the line width.

The data storage unit 262 further stores, for example, a calculation model M. The calculation model M is a correlation model shown by a relational expression (2) between the variation in line width $\Delta CD$ of the resist pattern and a temperature correction value $\Delta T$ as shown in FIG. 14. This calculation model M can calculate an optimum temperature correction value $\Delta T$ for making the line widths uniform within the wafer W based on the line width converted by the correlation function H. It should be noted that the calculation model M may be separated into a model component $\alpha$ which is affected, for example, by a resist solution and a model component Mt which is affected, for example, by processing conditions other than the resist solution. The processing conditions other than the resist solution mentioned here include, for example, the heating temperature, the heating time, the apparatus state, and so on which affect the line width.

As shown in FIG. 12, the program storage unit 263 stores, for example, a program P1 for calculating the reduction in film thickness based on the result of the film thickness measurement inputted and converting the reduction in film thickness into the line width by the correlation function H.

The program storage unit 263 stores, for example, a program P2 for calculating the temperature correction value $\Delta T$ for the heating plate 190 using the calculation model M based on the converted line width, a program P3 for changing the existing temperature setting of the temperature controller 192 based on the calculated temperature correction value $\Delta T$, and so on. Note that the various kinds of programs for realizing the function of the temperature setting unit 250 may be installed by a computer readable recording medium.

In this embodiment, the apparatus for setting the processing conditions in the photolithography process is composed of the film thickness measuring unit 110 and the temperature setting unit 250.

In the coating and developing treatment system 1 configured as described above, first of all, one unprocessed wafer W is taken out of the cassette C on the cassette mounting table 5 by the wafer carrier 7 shown in FIG. 1 and carried to the temperature regulating unit 60 included in the third processing unit group G3. The wafer W carried to the temperature regulating unit 60 is temperature-regulated to a predetermined temperature, and is then carried by the first carrier unit 10 into the bottom coating unit 23 where the wafer is formed with an anti-reflection film. The wafer W formed with the anti-reflection film is sequentially carried by the first carrier unit 10 to the heating unit 92, the high-temperature thermal processing unit 65, and the high-precision temperature regulating unit 70 so that predetermined processing is performed in each of the units. Thereafter, the wafer W is carried to the resist coating unit 20 where a resist film is formed on the wafer W. The wafer W is then carried by the first carrier unit 10 to the pre-baking unit 71 and subsequently carried by the second carrier unit 11 to the edge exposure unit 94 and the high-precision temperature regulating unit 83 so that the wafer W is subjected to predetermined processing in each of the units. Thereafter, the wafer W is carried by the wafer carrier 101 in the interface section 4 to the aligner E where the wafer is exposed to light in a predetermined pattern. The wafer W for which exposure processing has been finished is carried by the wafer carrier 101 to the PEB unit 84 where the wafer W is subjected to post-exposure baking.

In the PEB unit 84, first of all, the wafer W is carried in through the carry-in/out port 230 as shown in FIG. 9 and mounted on the cooling plate 220. Subsequently, the cooling plate 220 moves to the heating unit 171 side, and the wafer W is moved to a position above the heating plate 190. The first raising and lowering pins 200 mount the wafer W on the heating plate 190, whereby the wafer W is heated. After a lapse of a predetermined period, the wafer W is passed from the heating plate 190 to the cooling plate 220 again and cooled thereon, carried from the cooling plate 220 to the outside of the PEB unit 84 through the carry-in/our port 230, whereby a series of steps within the heat-processing is finished.

The wafer W for which the post-exposure baking has been finished is carried by the second carrier unit 11 to the high-precision temperature regulating unit 81 where the wafer W is temperature-regulated. The wafer W is then carried to the developing treatment unit 30 where the resist film on the wafer W is developed. The wafer W is then carried by the second carrier unit 11 to the post-baking unit 75 where the wafer W is subjected to heat-processing, and is then carried to the high-precision temperature regulating unit 63 where the wafer W is temperature-regulated. The wafer W is then carried by the first carrier unit 10 to the transition unit 61 and returned to the cassette C, thus completing a series of steps within the photolithography process.

Figure 15:
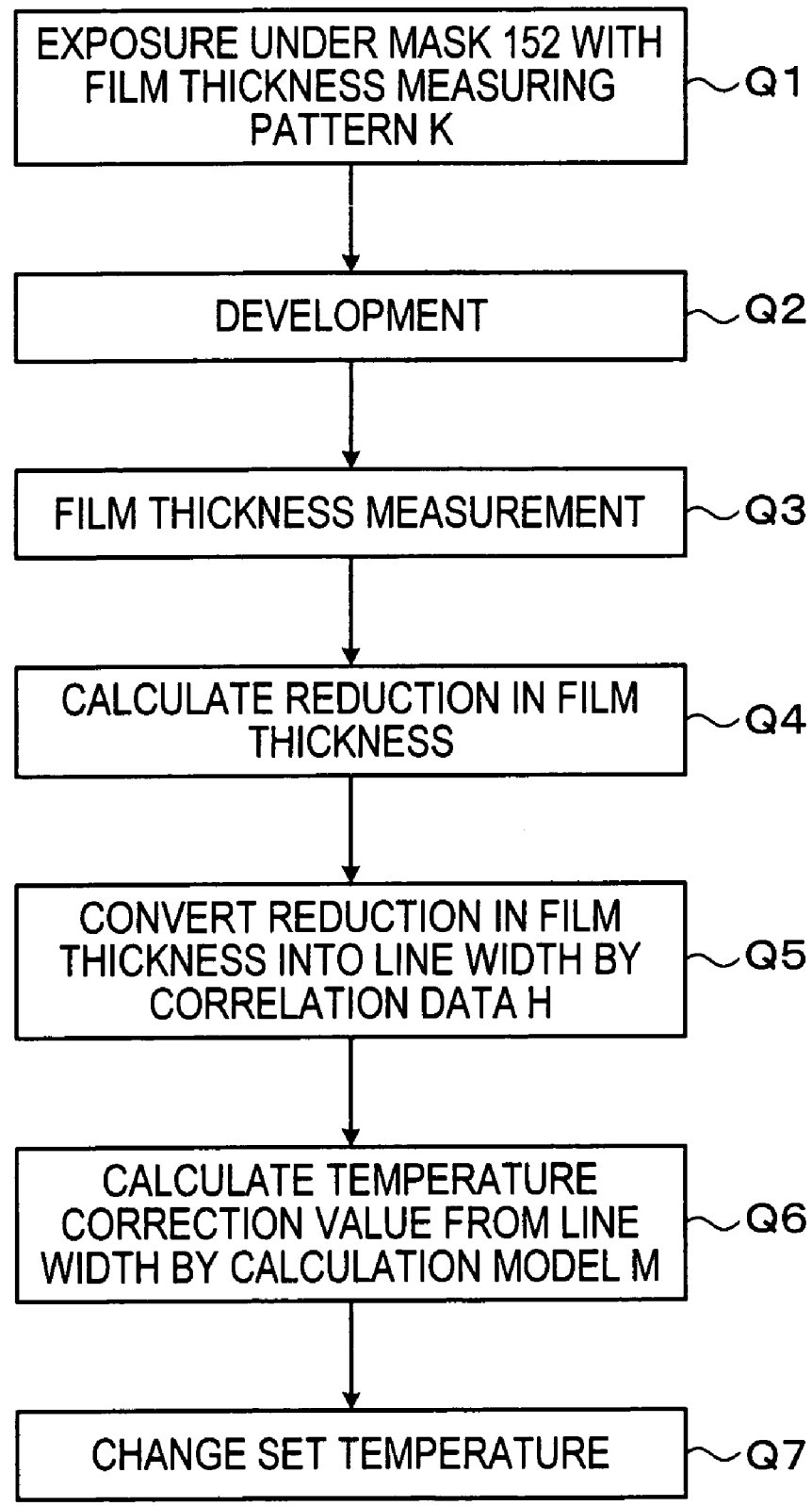
FIG. 15 is a flowchart of a temperature setting process.

Next, a temperature setting process for the heating plate 190 of the PEB unit 84 will be described. FIG. 15 is a flowchart of the temperature setting process.

First of all, under the existing processing condition setting, one wafer W is processed following the above-described photolithography process in the coating and developing treatment system 1. In this event, in the exposure processing in the aligner E, the zero-order light of the light source 151 is reduced to 10% by the second region J2 of the film thickness measuring pattern K in the mask 152 and then applied to the resist film, for example, on the wafer region $W_1$ (step Q1 in FIG. 15). On the other hand, by the first region J1 of the film thickness measuring pattern K, the light of the light source 151 is blocked. This result in that a portion U2 of the resist film on the wafer W corresponding to the second region J2 is exposed to light that is 10% of the initial zero-order light of the light source 151, while a portion U1 of the resist film corresponding to the first region J1 is exposed to no light as shown in FIG. 16. In this exposure processing, exposure using the film thickness measuring pattern K is similarly performed in sequence to the wafer regions $W_2$ to $W_5$, in addition to the wafer region $W_1$. In other words, the application of light from the light source 151 is performed, for example, the same number of times as that of the wafer regions, for example, five times.

Further, in the developing treatment performed after the post-exposure baking, the exposed portion of the resist film is dissolved in accordance with the exposure amount (step Q2 in FIG. 15). As shown in FIG. 16, the portion U2 of the resist film has been exposed to 10% of the light of the light source 151, so that the resist film remains though it is reduced. The portion U1 of the resist film is not exposed to light, so that 100% of the resist film remains.

The wafer W for which a series of steps within the photolithography process has been finished is carried, for example, by the wafer carrier 7 to the film thickness measuring unit 110. In the film thickness measuring unit 110, a film thickness A1 of the portion U1 of the resist film corresponding to the first region J1 and a film thickness A2 of the portion U2 corresponding to the second region J2 are measured for each of the wafer regions $W_1$ to $W_5$ (step Q3 in FIG. 15). The measurement result of the film thickness in each of the wafer regions $W_1$ to $W_5$ is inputed, for example, into the temperature setting unit 250.

In the temperature setting unit 250, a film thickness difference ΔA between the portion U1 and the portion U2 within each of the wafer regions $W_1$ to $W_5$ is calculated from the inputted film thickness measurement results of the portion U1 and the portion U2 of the resist film. The film thickness difference ΔA between them is the reduction in film thickness ΔA in each of the wafer regions $W_1$ to $W_5$ (step Q4 in FIG. 15). This reduction in film thickness ΔA is created by the exposure to the zero-order light, and therefore results only from the component of exposure amount at the time of exposure. Next, the reduction in film thickness ΔA within each of the wafer regions $W_1$ to $W_5$ is converted into the line width by the correlation function H (step Q5 in FIG. 15). This line width is a line width component depending only on the exposure amount at the time of exposure.

Subsequently, based on the line width within each of the wafer regions $W_1$ to $W_5$, the calculation model M calculates the temperature correction value ΔT for each of the heating plate regions $R_1$ to $R_5$, which makes the line widths uniform within the wafer (step Q6 in FIG. 15). For example, the difference between a common target line width and the line width within each of the wafer regions $W_1$ to $W_5$ is substituted as ΔCD into the left side of the relational expression (2), and each side is multiplied by the inverse matrix of the calculation model M. This calculates each temperature correction value ΔT for each of the heating plate regions $R_1$ to $R_5$.

Upon calculation of the temperature correction value ΔT for each of the heating plate regions $R_1$ to $R_5$, information of each temperature correction value ΔT is inputted from the communication unit 264 into the temperature controller 192. The temperature correction value for each of the heating plate regions $R_1$ to $R_5$ of the heating plate 190 in the temperature controller 192 is changed, and a new set temperature is set (step Q7 in FIG. 15). In this manner, the temperature setting process in the photolithography process is completed.

According to the above-described embodiment, in the photolithography process, exposure is performed using the mask 152 transmitting only the zero-order light, the film thickness of the resist film which is reduced by the subsequent development is measured, and the line width is calculated from that film thickness using the correlation function H. As described above, it is unnecessary to use the conventional CD-SEM to measure the line width, thus ensuring that the line width can be specified with accuracy and in a short time without damage to the resist pattern on the wafer W.

Further, the exposure is performed using the mask 152 transmitting only the zero-order light, so that the exposure can be performed depending only on the exposure amount with the focus component being removed from the light of the light source 151. The reduction in film thickness of the resulting reduced resist film is converted into the line width, based on which the temperature correction value for each of the heating plate regions $R_1$ to $R_5$ is calculated. In this manner, the line width independent from the focus component at the time exposure is calculated, base on which the temperature correction values for the heating plate regions $R_1$ to $R_5$ are calculated, so that more accurate temperature setting can be performed based on the controllable line width component.

Further, the film thickness measuring pattern K reduces the light of the light source 151, thereby ensuring that the resist film remains more surely to allow proper measurement of the film thickness of each of the portions U1 and U2 of the resist film.

The film thickness difference between the portion U2 of the resist film irradiated with light and the portion U1 of the resist film irradiated with no light is calculated and the calculated film thickness difference is regarded as the reduction in film thickness ΔA, thus making it possible to cancel an error in the film thickness measurement due to, for example, a base film so as to calculate the reduction in film thickness more accurately.

Although the film thickness measuring pattern K in the mask 152 is formed with the second region J2 with a transmittance of 10% in the above embodiment, it may be formed with a plurality of regions which are different in transmittance from each other.

Figure 17:
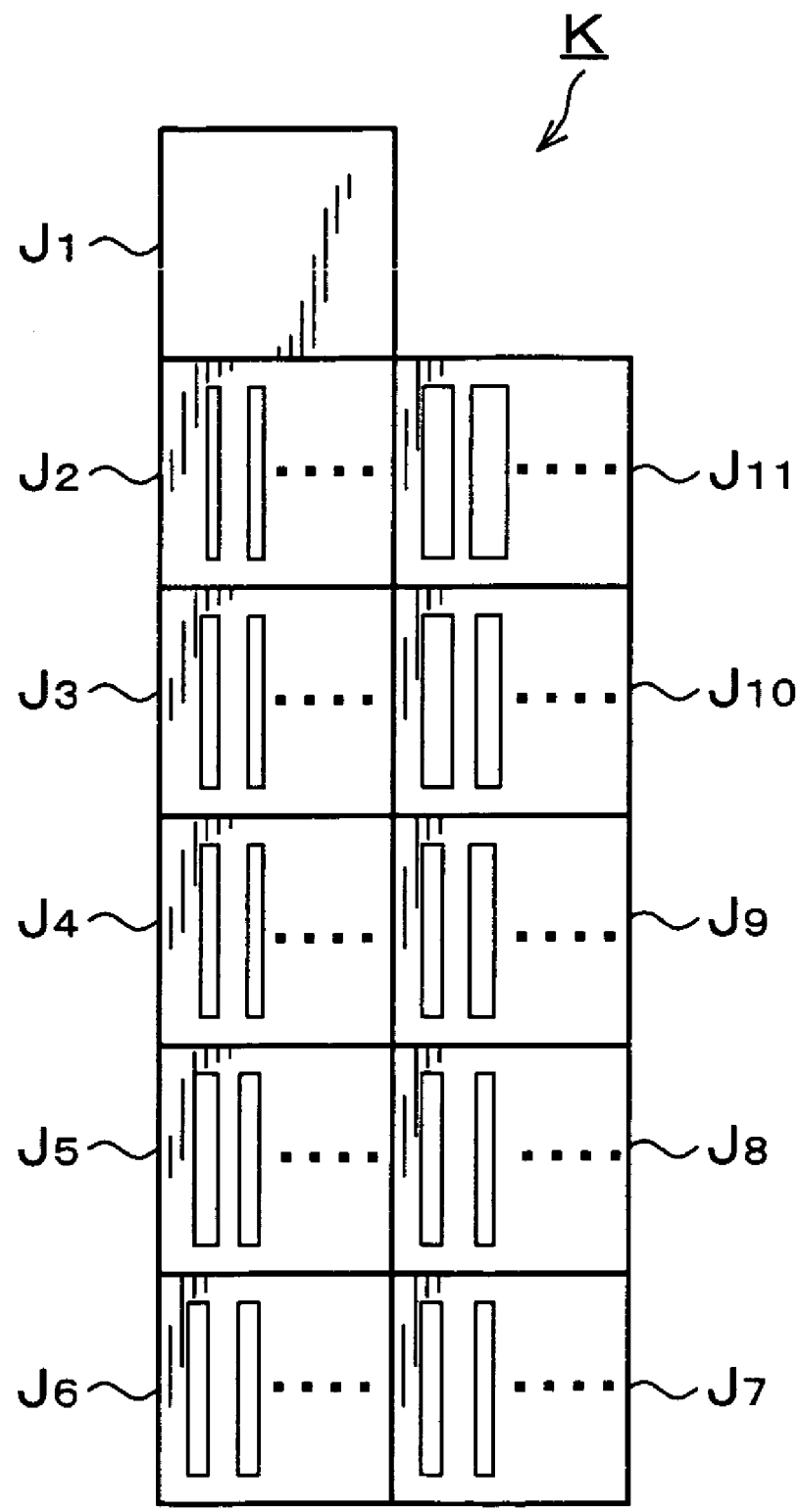
FIG. 17 is an explanatory view showing a film thickness measuring pattern formed with a plurality of regions different in transmittance.

FIG. 17 shows an example of that pattern, in which a film thickness measuring pattern K in a mask 152 is formed with ten regions J2 to J11 different in transmittance as well as a first region J1 transmitting no light. For example, the regions J1 to J11 are formed such that the transmittance increases on a step-by-step basis from 0% to 100% in increments of 10%. The transmittance of each of the regions J2 to J11 is adjusted by changing the width D of the slit V similarly to the above-described pattern B shown in FIG. 6. The above-described correlation function H between the reduction in film thickness and the line width is obtained for each of the regions J2 to J11, respectively.

At the time of setting the temperature of the heating plate 190 of the PEB unit 84, any of the regions J2 to J11 is selected according to, for example, the sensitivity of the resist solution in use. At the time of measuring the film thickness, the film thickness difference is measured, the difference between the resist film exposed to light through a selected region Jx and the resist film corresponding to the first region J1 transmitting no light. Thereafter, the line width is calculated by the correlation function H corresponding to the selection region Jx, and then the temperature correction value for each of the heating plate regions $R_1$ to $R_5$ is calculated as described above. In this case, even when a plurality of kinds of resist solutions different in sensitivity are used in the above-described photolithography process, the resist films are allowed to remain surely by using, at the time of exposure, any of the regions J2 to J11 which are different in transmittance. Accordingly, the reduction in film thickness of the resist film can be measured even without replacing one mask 152 with another every time the resist solution is changed.

Although the heating temperature of the post-exposure baking is set based on the converted line width in the above embodiment, the exposure amount by the aligner E may be set. In this case, a calculation model including a relational expression between the variation in line width ΔCD and the exposure amount correction value is previously created. Then, the exposure amount correction value which makes the line widths uniform within the wafer is calculated by the calculation model based on the line width converted from the reduction in film thickness ΔA as described above. Also in this case, the line width is calculated based on the reduction in film thickness affected only by the component of exposure amount, and the exposure amount is corrected based on the line width, so that the processing condition can be set accurately with high precision.

Although the setting of the heating temperature after the time of exposure and the setting of the exposure amount at the time of exposure in the photolithography process are performed based on the converted line width in the above embodiment, other processing conditions may be set such as the heating temperature at the time of heat-processing after the resist coating or the like.

Although the reduction in film thickness ΔA being the film thickness difference between the portion U1 and the portion U2 of the resist film is converted into the line width by the correlation function H in the above embodiment, a film thickness A2 of the portion U2 reduced by the exposure may be directly converted into the line width. In this case, the film thickness A2 is converted into the line width by a previously obtained correlation function between the film thickness and the line width.

One example of the embodiment of the present invention has been described, but the present invention is not limited to the example and may take various forms. For example, the present invention is also applicable to setting of processing conditions in the photolithography process of substrates other than the wafer, such as an FPD (Flat Panel Display), a mask reticle for a photomask, and so on.

The present invention is useful in grasping the state of the line width quickly and accurately and adjusting the heating temperature and the exposure amount based on the line width in the setting of the conditions in the photolithography process of a substrate.

What is claimed is:

1. A method of setting a processing condition in a photolithography process of forming a resist pattern on a substrate, comprising the steps of:
   exposing a film on the substrate to light using a mask transmitting only zero-order light of a light source and then developing the film to reduce the film on the substrate in the photolithography process in which a certain processing condition has been already set;
   measuring a film thickness of the reduced film;
   converting the measured film thickness into a line width of the resist pattern by a previously obtained correlation between the film thickness and the line width; and
   setting a new processing condition based on the converted line width.

2. The method of setting a processing condition in a photolithography process as set forth in claim 1, wherein
   a heating temperature at the time of heating after the exposure and before the development in the photolithography process is set based on the converted line width.

3. The method of setting a processing condition in a photolithography process as set forth in claim 1, wherein
   an exposure amount at the time of exposure in the photolithography process is set based on the converted line width.

4. The method of setting a processing condition in a photolithography process as set forth in claim 1, wherein:
   a reduction in film thickness is calculated from the measured film thickness; and
   the calculated reduction in film thickness is converted into the line width of the resist pattern by a previously obtained correlation between the reduction in film thickness and the line width.

5. The method of setting a processing condition in a photolithography process as set forth in claim 4, wherein:
   the substrate is exposed to light using a mask having a region transmitting the zero-order light of the light source and a region not transmitting the light of the light source; and
   the reduction in film thickness is obtained by calculating a film thickness difference between portions of the film on the substrate corresponding to the two regions.

6. The method of setting a processing condition in a photolithography process as set forth in claim 5, wherein
   said mask is formed with a plurality of regions which transmit the zero-order light and are different in transmittance.

7. An apparatus for setting a processing condition in a photolithography process of forming a resist pattern on a substrate, comprising:
   a film thickness measuring unit for measuring a thickness of a film on the substrate when the film on the substrate is exposed to light using a mask transmitting only zero-order light of a light source and then developed to be reduced in the photolithography process in which a certain processing condition has been already set; and
   a setting unit for converting the measured film thickness into a line width of the resist pattern by a previously obtained correlation between the film thickness and the line width, and setting a new processing condition based on the converted line width.

8. The apparatus for setting a processing condition in a photolithography process as set forth in clam 7, wherein
   said setting unit sets a heating temperature at the time of heating after the exposure and before the development in the photolithography process based on the converted line width.

9. The apparatus for setting a processing condition in a photolithography process as set forth in clam 8, wherein
   said setting unit sets an exposure amount at the time of exposure in the photolithography process based on the converted line width.

10. The apparatus for setting a processing condition in a photolithography process as set forth in clam 7, wherein
    said setting unit calculates a reduction in film thickness from the measured film thickness, and converts the calculated reduction in film thickness into the line width of the resist pattern by a previously obtained correlation between the reduction in film thickness and the line width.

11. The apparatus for setting a processing condition in a photolithography process as set forth in clam 10, wherein
    said mask is formed with a region transmitting the zero-order light of the light source and a region not transmitting the light of the light source; and
    said setting unit obtains the reduction in film thickness by calculating a film thickness difference between portions of the film on the substrate corresponding to the two regions of said mask.

12. The apparatus for setting a processing condition in a photolithography process as set forth in clam 11, wherein
    said mask is formed with a plurality of regions which transmit the zero-order light and are different in transmittance.

13. A computer program product used in an apparatus for setting a processing condition in a photolithography process, said setting apparatus including:
    a film thickness measuring unit for measuring a thickness of a film on a substrate when the film on the substrate is exposed to light using a mask transmitting only zero-order light of a light source and then developed to be reduced in the photolithography process in which a certain processing condition has been already set; and a setting unit, and
    said computer program product comprising:
    computer readable program code means for causing a computer to convert the film thickness measured by the film thickness measuring unit into a line width of a resist pattern by a previously obtained correlation between the film thickness and the line width and to set a new processing condition based on the converted line width, in the setting apparatus.

14. A computer readable recording medium recording thereon a computer program product used in an apparatus for setting a processing condition in a photolithography process, said setting apparatus including:
    a film thickness measuring unit for measuring a thickness of a film on a substrate when the film on the substrate is exposed to light using a mask transmitting only zero-order light of a light source and then developed to be reduced in the photolithography process in which a certain processing condition has been already set; and a setting unit, and said computer program product comprising:

computer readable program code means for causing a computer to convert the film thickness measured by the film thickness measuring unit into a line width of a resist pattern by a previously obtained correlation between the film thickness and the line width and to set a new processing condition based on the converted line width, in the setting apparatus.

* * * * *